COMPOUND DEMODULATOR

Filed Aug. 4, 1959

INVENTORS
KENNETH P. CONGDON
EMMERY J. H. BUSSARD
BY
Darby + Darby
ATTORNEYS

June 14, 1960 K. P. CONGDON ET AL 2,941,076

COMPOUND DEMODULATOR

Filed Aug. 4, 1959 2 Sheets-Sheet 2

INVENTORS
KENNETH P. CONGDON
EMMERY J.H. BUSSARD
BY Darby & Darby
ATTORNEYS

United States Patent Office 2,941,076 Patented June 14, 1960

2,941,076

COMPOUND DEMODULATOR

Kenneth P. Congdon and Emmery J. H. Bussard, Cincinnati, Ohio, assignors to Avco Corporation, Cincinnati, Ohio, a corporation of Delaware Filed Aug. 4, 1959, Ser. No. 831,651

11 Claims. (Cl. 250—31)

This invention relates to demodulators and more particularly to a novel compound demodulator having an extended dynamic range of operation.

Basically, demodulators are employed to recover the modulation envelope of an amplitude modulated signal wave. For example, in AM radio, demodulators are utilized to recover the intelligence transmitted by amplitude modulated radio frequency signals. Additionally, in FM radio, where the frequency of the transmitted wave is varied, demodulators are used with frequency discriminators to recover the transmitted intelligence after the discriminator has converted the frequency variations of the transmitted signal into corresponding amplitude variations. Regardless of the application, however, it is desirable that demodulators be capable of functioning over an extended dynamic range of input signal levels. When the lower end of the signal range to be covered is a very small voltage signal, a serious problem arises because of the inherent limitations of the known types of demodulating apparatus. Diode rectifiers, for example, have a threshold signal level, below which they will not conduct and hence will not function as a demodulator. Even where diodes of the semi-conductor type are utilized, the lower limit of their operating range is determined by their contact potential. In some applications, it has been proposed to employ transistors as demodulators, by reducing their forward bias to the point where they function as semi-conductor diode type rectifiers. While this arrangement permits low level signals to be demodulated, the dynamic operating range is reduced because of the tendency of the transistor amplifier to quickly reach overload saturation at the higher signal levels.

Accordingly, it is an object of this invention to provide a novel, compound demodulator which is especially suited for demodulating low level input signals, but which also has an extended dynamic range of operation.

It is a further object of this invention to provide a compound demodulator which combines the most desirable demodulation characteristics of semi-conductors of the diode and transistor classes.

It is a still further object of this invention to provide a compound demodulator which may be constructed of low cost, commercially available components and which exhibits a high gain over an extended dynamic signal range with a linear response at the higher signal levels.

It is an additional object of this invention to provide a compound demodulator which permits the matching of a high impedance input to a low impedance load and wherein the A.C./D.C. ratio of demodulation approaches unity.

Briefly, according to the invention, demodulation is accomplished by passing the signals to be demodulated through rectifier means, passing the output signals from the rectifier means through a biased transistor amplifier, and varying the bias on the transistor amplifier in response to the level of the input signals, so that the transistor amplifier acts as a rectifier for input signal levels below the threshold signal level of the rectifier means and acts as an amplifier to amplify the output signals from the rectifier means for input signal levels above the threshold signal level of the rectifier means. In the embodiment of the invention illustrated and described herein, a voltage doubler rectifier formed by semiconductor diodes is coupled to the input of a transistor amplifier and the amplifier is initially biased to the operating region wherein the amplifier functions to rectify signals applied to it. For input signal levels below the threshold signal level of the rectifier, the rectifier acts as a capacitive coupling network to couple the input signals to the transistor amplifier, which then functions as the primary rectifying or demodulating means to accomplish the desired demodulation of the input signals. As the input signal level is increased above the threshold signal level of the rectifier, the rectifier begins to conduct and supplies an output signal, which is the modulation envelope of the input signal wave, to the input of the transistor amplifier. The modulation envelope, of course, contains a D.C. component, which when applied to the input of the transistor amplifier, serves to increase the bias on the amplifier, so that the transistor amplifier is biased more and more into its normal operating region wherein it acts to amplify the output signals from the rectifier.

By virtue of this arrangement, the transistor amplifier functions as the primary demodulation means for signal levels below the threshold signal level of the rectifier and functions as an amplifier for the output signals from the rectifier, when the rectifier itself becomes the primary demodulation means as the input signal level increases. Since the transistor amplifier is initially biased to the region wherein it acts as a rectifier and the bias on the amplifier is increased in response to the level of the input signals to the demodulator, the transistor amplifier is prevented from quickly reaching overload saturation, so that the demodulating function may be carried out over a wide range of input signal levels. If desired, the diodes forming the voltage doubler rectifier could be paralleled with other diodes having dissimilar transfer characteristic curves, so that the demodulator is adapted to handle an even wider dynamic range of input signal levels. Furthermore, if the variations in ambient temperature are great enough to affect the operation of the transistor amplifier, the biasing means for the amplifier may include a temperature responsive impedance element, such as a thermistor, for example, to compensate for the change in temperature. Similarly, a wide change in supply voltage for the amplifier could be compensated for by the inclusion in the bias means of an impedance element having a non-linear transfer characteristic, such as a varistor, for example.

Figure 1:
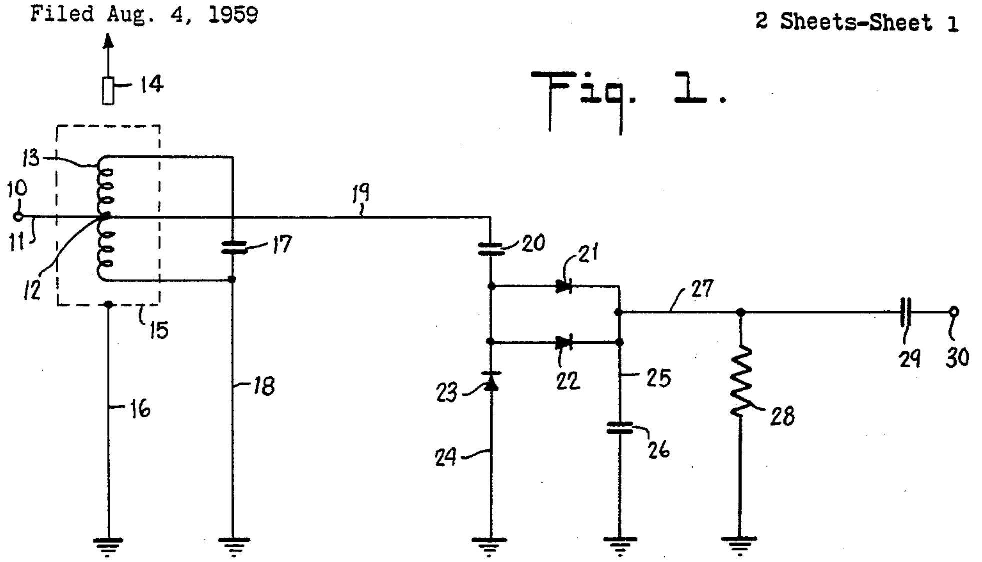
Fig. 1 is a circuit diagram of a known type of half-wave, voltage doubler rectifier employed for demodulation purposes.

Referring now to Fig. 1 of the drawings, there is shown a known type of demodulator employing a half-wave, voltage doubler rectifier. As seen therein, the demodulator comprises an input terminal 10 which is connected by a lead 11 to a tap 12 on an inductance winding 13. A movable tuning slug 14 is arranged to vary the inductance of the winding 13. The winding 13 is enclosed by a shielding can 15 which is grounded by a lead 16, so that the pick-up of hum and other interference is minimized. A capacitor 17 is shunted across the inductance winding 13 and the combination is connected to ground by a lead 18, so that the inductance winding and the capacitor form a parallel-tuned circuit which is tuned to the frequency of the input signals to be demodulated. The input signals are coupled from the winding 13 to the circuit junction of the series and shunt arms of a half-wave, voltage doubler rectifier by means of a lead 19 and a capacitor 20. The series arm of the doubler rectifier comprises a semi-conductor diode 21 connected in parallel-circuit with a semi-conductor diode 22. When the series diodes 21 and 22 are both of the same class or type, they may be selected to have dissimilar transfer characteristic curves, so that the rectifier may more readily handle the wide dynamic voltage range encountered in many applications. It is also possible to employ a diode of one type for one of the series diodes and a diode of another type for the other of the series diodes, for example, a silicon diode and a germanium diode. The circuit junction of the capacitor 20 and the parallel-connected diodes 21 and 22 is connected to ground by a semi-conductor shunt diode 23 and a lead 24. Finally, the output of the voltage doubler rectifier is coupled to ground by a lead 25 and a capacitor 26 and to an output terminal 30 by means of a lead 27 and a coupling network comprising resistor 28 and capacitor 29.

In operation, the capacitor 20 is charged during one-half-cycle through the diode 23 to the peak input voltage applied. During the next half-cycle, the capacitor 26 is charged through diodes 21 and 22 to the potential determined by that across capacitor 20 and the peak input voltage. Because of this action, the output from the voltage doubler rectifier is approximately twice the peak applied input voltage. Furthermore, an amplitude modulated input signal, for example, an RF signal, applied to input terminal 10 will be rectified by the doubler rectifier to provide an output signal at the terminal 30 which is the modulation envelope of the applied input signal. While this circuit is quite satisfactory for many applications, it is unsatisfactory for demodulating input signals at levels below the threshold signal level of the diodes forming the voltage doubler rectifier. When the diodes are of the semi-conductor type, the threshold signal level is determined by the contact potential of the diode employed. Accordingly, the lower limit of demodulation is determined by the characteristics of the diode devices employed in the rectifier.

Figure 2:
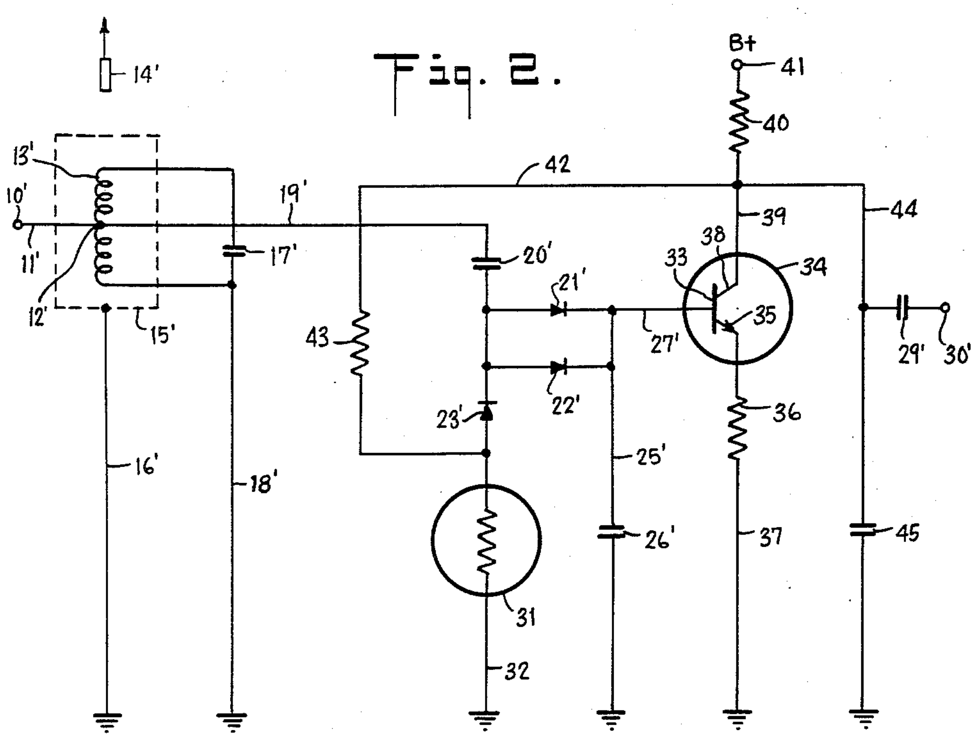
Fig. 2 is a circuit diagram of a compound demodulator constructed in accordance with the teachings of the present invention.

A compound demodulator constructed in accordance with the teachings of the invention is illustrated in Fig. 2 of the drawings, wherein the same reference characters, but with a prime notation, are employed to designate circuit elements common to the demodulators of Figs. 1 and 2. As seen in Fig. 2, the input signals to be demodulated are applied to input terminal 10′ and are passed through the parallel-tuned circuit consisting of winding 13′ and capacitor 17′ to the input of the voltage doubler rectifier by means of lead 19′. Again, the voltage doubler rectifier comprises capacitor 20′, semi-conductor series diodes 21′ and 22′, semi-conductor shunt diode 23′ and capacitor 26′. In this arrangement, however, the shunt diode 23′ is coupled to ground through a temperature responsive impedance element, such as the thermistor 31 illustrated, and a lead 32. The output of the voltage doubler rectifier is directly connected by lead 27′ to the base element 33 of a transistor 34, which may be an NPN junction transistor, as illustrated, for example. The emitter element 35 of the transistor is connected to ground by means of an emitter resistance 36 and a lead 37, so that the transistor amplifier thus formed is arranged in base input-grounded emitter circuit configuration. The collector element 38 of the transistor is coupled by a lead 39 and a load resistor 40 to the terminal 41 of a source (not shown) of D.C. bias supply voltage. A lead 42 and a base bias resistor 43 serve to couple the collector element 38 of the transistor to the circuit junction of the serially-connected shunt diode 23′ and the thermistor 31. Finally, the collector element is coupled by means of lead 44, RF bypass capacitor 45 and coupling capacitor 29′ to the output terminal 30′ of the demodulator.

In operation, the input signals applied to terminal 10′ are coupled by lead 19′ to the voltage doubler rectifier formed by the semi-conductor diodes 21′, 22′ and 23′ and the capacitors 20′ and 26′. For input voltage levels which are below the contact potential of the semi-conductor diodes, the diodes act merely as coupling capacitors to couple the applied input signals directly to the base input element 33 of the transistor amplifier 34. Since transistors are inherently semi-conductor diode devices and will operate as transistor amplifiers only when properly biased in a forward direction, the transistor amplifier 34 is biased much below its normal bias level, so that it effectively acts as a rectifier to demodulate those input signals which are at voltage levels below the contact potential of the diodes of the voltage doubler rectifier. In the base input type of transistor amplifier illustrated, the bias is obtained from the terminal 41 of the D.C. bias supply voltage source and is applied by means of a voltage divider formed by base bias resistor 43 and thermistor 31 to the base element 33, through the diodes of the voltage doubler rectifier. Since the thermistor element 31 has a resistance which varies with temperature, it acts to compensate for bias variations caused by variations in the cut-off collector current of the transistor with temperature, so that the amplifier is stabilized for operation over a wide temperature range. As the input signal voltage increases to the point where the diodes of the voltage doubler rectifier become effective to rectify, a D.C. component appears in the output of the voltage doubler rectifier and is applied to the base element 33 of the transistor. This D.C. component provides additional bias and elevates the base element of the transistor into the operating region wherein the transistor functions as an amplifier to amplify the signals applied to the base. Therefore, as the input signal level increases, the bias applied to the base element of the transistor also increases until the amplifier finally is driven to saturation by overloading.

Figure 3:
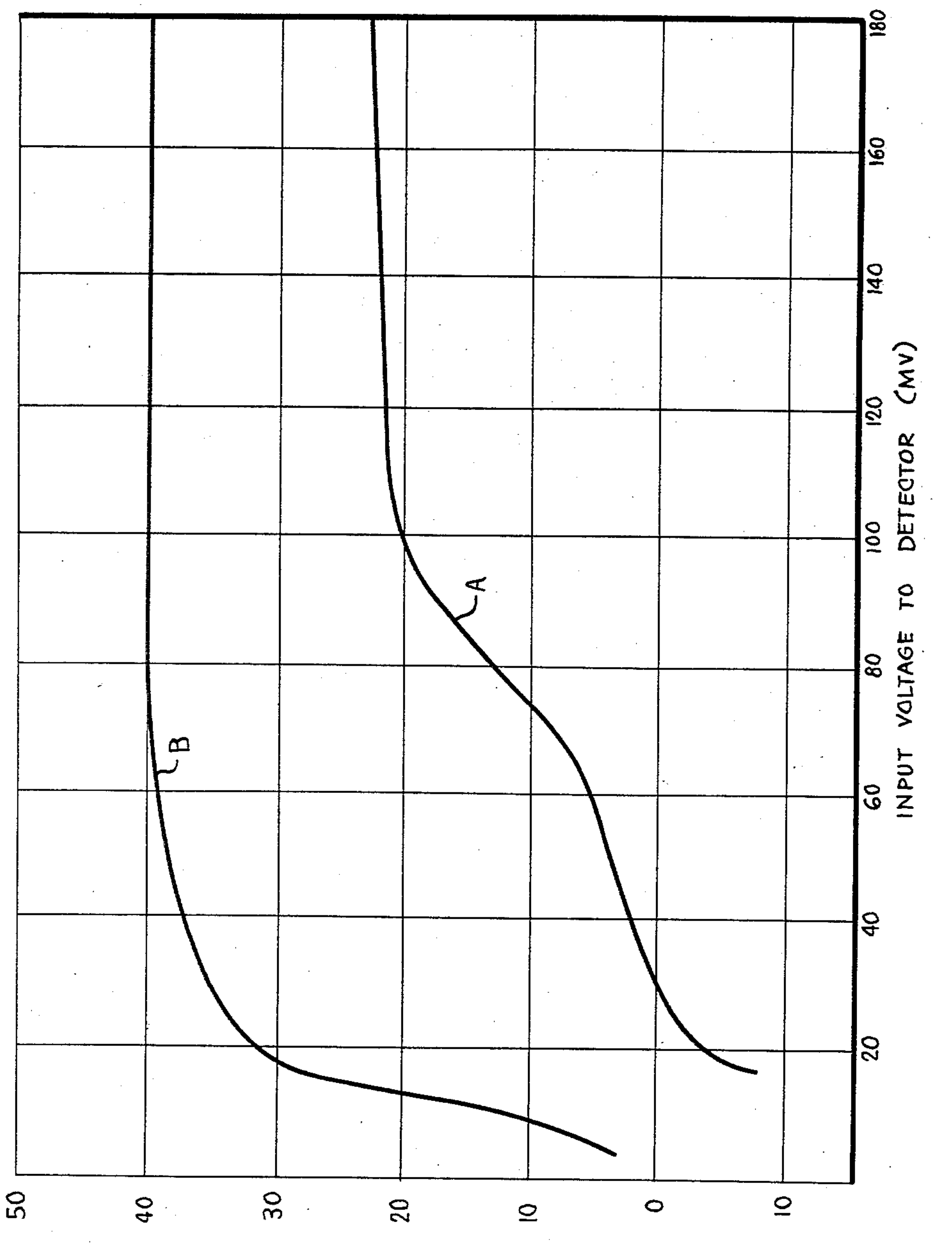
Fig. 3 is a graph showing the demodulation characteristic curves of the demodulators of Figs. 1 and 2.

From the foregoing description of the compound demodulator of the invention, it is believed apparent that a demodulator has been provided having an extended range of operation and which is especially suited for low input signal levels. Furthermore, the demodulator of the invention makes use of the most desirable demodulation characteristics of semi-conductor demodulators of the diode and transistor classes without incurring the disadvantages produced by the use of either type alone. A measure of the efficiency of operation of the demodulator of the invention may be seen by reference to Fig. 3 of the drawings, wherein curve "A" represents the demodulation characteristic curve of a voltage doubler type demodulator as illustrated in Fig. 1, while curve "B" represents the demodulation characteristic curve of the compound demodulator of Fig. 2. In obtaining these curves, the same diodes were employed for the voltage doubler rectifier in both demodulators. By comprising curves "A" and "B" of Fig. 3, it is seen that with the compound demodulator of the invention, demodulation of a relatively high order occurs at a much lower signal level than with the conventional voltage doubler demodulator. Furthermore, the rise characteristic of the curve for the compound demodulator of the invention is very much steeper than the rise characteristic of the curve for the conventional demodulator, so that the compound demodulator is essentially at full operating efficiency by the time the diode rectifier action starts. Additionally, the voltage gain of the compound demodulator of the invention is materially higher than the voltage gain of the conventional voltage doubler type demodulator for all signal levels.

While the compound demodulator shown in Fig. 2 of the drawings operates satisfactorily with power supply voltage variations as high as 30%, which is compatable with normal radio equipment design, the allowable power supply voltage variation may be increased by the incorporation in the bias circuit of the transistor of a suitable impedance element having a non-linear transfer characteristic curve, such as a varistor, for example. Also, the thermistor 31 may be omitted for applications where extreme temperature variations are not encountered, such as, for example, in equipment designed primarily for home or office use. In this case, the D.C. bias may be supplied directly to the base element of the transistor by connecting the base bias resistor 43 between the collector element 38 and the base element 33. Finally, it may be noted that by using an unbypassed emitter resistance 36 in the transistor amplifier, sufficient degeneration is provided to assure linearity of operation of the amplifier with good stabilization.

It is believed apparent that many changes could be made in the above-described demodulator and many seemingly different embodiments of the invention constructed without departing from the scope thereof. For example, many different rectifier circuit configurations could be employed in place of the voltage doubler type illustrated and other types of diodes or transistors utilized. Accordingly, it is intended that all matter contained in the above description or shown in the accompanying drawings shall be interpreted as illustrative and not in a limiting sense.

What is claimed is:

1. A compound demodulator comprising rectifier means having an input and an output and including a diode having its cathode forming an output connection, said input beign adapted to be coupled to a source of input signals to be demodulated; transistor amplifier means having an input coupled to the output of said rectifier means; and variable bias means for biasing said transistor amplifier means in response to the level of said input signals, so that said transistor amplifier means acts to rectify said input signals for input signal levels below the threshold signal level of said rectifier means and acts to amplify the output signals from said rectifier means for input signal levels above said threshold signal level.

2. A compound demodulator comprising rectifier means having an input and an output and including a diode having its cathode forming an output connection, said input being adapted to be coupled to a source of input signals to be demodulated; transistor amplifier means having an input coupled to the output of said rectifier means; and bias means coupled to the input of said transistor amplifier means for biasing said amplifier means to the operating region wherein said amplifier means acts as a rectifier, whereby said bias means and said rectifier means combine to variably bias said transistor amplifier means in response to the level of said input signals, so that said amplifier means acts to rectify said input signals for input signal levels below the threshold signal level of said rectifier means and acts to amplify the output signals from said rectifier means for input signal levels above said threshold signal level.

3. A compound demodulator comprising semi-conductor diode rectifier means having an input and a cathode output, said input being adapted to be coupled to a source of input signals to be demodulated; transistor amplifier means having an input coupled to the output of said diode rectifier means; and D.C. bias means coupled to the input of said transistor amplifier means for biasing said amplifier means to the operating region wherein said amplifier means acts as a rectifier, whereby said bias means and said diode rectifier means combine to variably bias said transistor amplifier means in response to the voltage level of said input signals, so that said amplifier means acts to rectify said input signals for input signal voltage levels below the contact potential of said diode rectifier means and acts to amplify the output signals from said rectifier means for input signal voltage levels above said contact potential.

4. A compound demodulator as claimed in claim 3, wherein said rectifier means comprises at least a pair of diodes arranged in voltage doubler circuit configuration.

5. A compound demodulator as claimed in claim 3, wherein said bias means includes temperature compensating means for varying the D.C. bias on said transistor amplifier means in response to temperature.

6. A compound demodulator comprising diode rectifier means having an input and a cathode output, said input being adapted to be coupled to a source of input signals to be demodulated; a transistor amplifier having at least base, emitter and collector elements, said amplifier being arranged in base input circuit configuration and having said base element coupled to the output of said rectifier means; and D.C. bias means coupled to the base element of said transistor amplifier for biasing said amplifier to the operating region wherein said amplifier acts as a rectifier, whereby the D.C. bias from said bias means and the D.C. component of the output of said rectifier means combine to provide a D.C. bias for the base element of said amplifier which varies in response to the voltage level of said input signals, so that said transistor amplifier acts to rectify said input signals for input signal voltage levels below the threshold signal level of said rectifier means and acts to amplify the output signals from said rectifier means for input signal voltage levels above said threshold signal level.

7. A compound demodulator comprising at least a pair of semi-conductor diodes arranged in voltage doubler rectifier circuit configuration having an cathode output and an input adapted to be coupled to a source of input signals to be demodulated; a transistor amplifier having at least base, emitter and collector elements, said amplifier being arranged in base input circuit configuration and having said base element coupled to the output of said voltage doubler rectifier; and D.C. bias means coupled to the base element of said transistor amplifier for biasing said amplifier to the operating region wherein said amplifier acts as a rectifier, whereby the D.C. bias from said bias means and the D.C. component of the output of said voltage doubler rectifier combine to provide a D.C. bias for the base element of said amplifier which varies in response to the voltage level of said input signals, so that said transistor amplifier acts to rectify said input signals for input signal voltage levels below the contact potential of said diodes and acts to amplify the output signals from said voltage doubler rectifier for input signal voltage levels above said contact potential.

8. A compound demodulator as claimed in claim 7, wherein said voltage doubler rectifier includes an additional semi-conductor diode shunting one diode of said pair of diodes, said additional diode and said one diode having dissimilar transfer characteristic curves, to thereby extend the dynamic voltage range of operation of the demodulator.

9. A compound demodulator as claimed in claim 7, wherein said bias means includes a temperature responsive impedance element to compensate for the effects of temperature variation on the transistor amplifier operation.

10. A compound demodulator comprising a half-wave voltage doubler rectifier having an input and an output, said input being adapted to be coupled to a source of signals to be demodulated, said rectifier including a pair of parallel-connected semi-conductor series diodes having dissimilar transfer characteristic curves and poled with their cathodes on the output side, a first capacitor connected in series-circuit with said pair of diodes between said input and output, a semi-conductor shunt diode connected to the circuit junction of said capacitor and series diodes and shunting said input, and a second capacitor shunting said output; a transistor amplifier having at least base, emitter and collector elements, said amplifier being arranged in base input-grounded emitter circuit configuration and having said base element coupled to the output of said voltage doubler rectifier; and D.C. bias means coupled to said base element for biasing said amplifier to the operating region wherein said amplifier acts as a rectifier, said bias means including a thermistor serially connnected with said shunt diode and a base bias resistor coupled between said collector element and the circuit junction of said thermistor and shunt diode, whereby the D.C. bias from said bias means and the D.C. component of the output of said voltage doubler rectifier combine to provide a temperature compensated D.C. bias for the base element of said amplifier which varies in response to the voltage level of said input signals, so that said amplifier acts to rectify said input signals for input signal voltage levels below the contact potential of said diodes and acts to amplify the output signals from said voltage doubler rectifier for input signal voltage levels above said contact potential.

11. A compound demodulator comprising rectifier means having an input and an output, said input being adapted to be coupled to a source of input signals to be demodulated; transistor amplifier means having an input coupled to the output of said rectifier means, the transistor amplifier means and rectifier means being poled so that the transistor amplifier means is driven in the forward direction; and variable bias means for biasing said transistor amplifier means in response to the level of said input signals, so that said transistor amplifier means acts to rectify said input signals for input signal levels below the threshold signal level of said rectifier means and acts to amplify the output signals from said rectifier means for input signal levels above said threshold signal level.

References Cited in the file of this patent

UNITED STATES PATENTS

| | | |
|---|---|---|
| 2,866,892 | Barton | Dec. 30, 1958 |
| 2,887,540 | Aronson | May 19, 1959 |

OTHER REFERENCES

Transistor Circuit Handbook, "Garner," page 95.